United States Patent
Azuma et al.

[11] Patent Number: 6,051,369
[45] Date of Patent: Apr. 18, 2000

[54] LITHOGRAPHY PROCESS USING ONE OR MORE ANTI-REFLECTIVE COATING FILMS AND FABRICATION PROCESS USING THE LITHOGRAPHY PROCESS

[75] Inventors: Tsukasa Azuma, Tokyo; Takashi Sato, Yokohama, both of Japan

[73] Assignee: Kabushiki Kaisha Toshiba, Kawasaki, Japan

[21] Appl. No.: 09/004,390

[22] Filed: Jan. 8, 1998

[51] Int. Cl.⁷ .................................................. G03F 7/00
[52] U.S. Cl. ...................... 430/312; 430/313; 430/314; 430/316
[58] Field of Search ................... 430/312, 313, 430/314, 316, 317

[56] References Cited

U.S. PATENT DOCUMENTS

| | | | |
|---|---|---|---|
| 2,251,365 | 8/1941 | Miller | 95/2 |
| 3,884,698 | 5/1975 | Kakihama et al. | 117/217 |
| 4,529,685 | 7/1985 | Borodovsky | 430/311 |
| 4,668,606 | 5/1987 | DoMinh et al. | 430/271 |
| 4,977,070 | 12/1990 | Winslow | 430/510 |
| 5,126,289 | 6/1992 | Ziger | 437/231 |
| 5,286,608 | 2/1994 | Koh | 430/313 |
| 5,450,238 | 9/1995 | Bjornard et al. | 359/580 |
| 5,512,422 | 4/1996 | Hanawa et al. | 430/325 |
| 5,536,792 | 7/1996 | Hogan et al. | 525/432 |
| 5,539,255 | 7/1996 | Cronin | 257/750 |
| 5,580,700 | 12/1996 | Rahman | 430/311 |
| 5,635,423 | 6/1997 | Huang et al. | 437/195 |
| 5,686,354 | 11/1997 | Avanzino et al. | 437/190 |
| 5,733,714 | 3/1998 | McCulloch et al. | 430/325 |
| 5,741,626 | 4/1998 | Jain et al. | 430/314 |
| 5,759,746 | 6/1998 | Azuma et al. | 430/313 |
| 5,759,911 | 6/1998 | Cronin et al. | 438/622 |
| 5,801,094 | 9/1998 | Yew et al. | 438/624 |

*Primary Examiner*—Sharon Gibson
*Assistant Examiner*—Jill N. Holloman
*Attorney, Agent, or Firm*—Banner & Witcoff, Ltd.

[57] ABSTRACT

A lithography process includes a step of forming an antireflective coating film on a substrate. A film is formed on the antireflective film and a radiation sensitive film is formed on the film. The radiation sensitive film is selectively exposed. During the selective exposing, the antireflective film covers the lower surface of the portion of film on which the radiation sensitive film is formed, and the antireflective coating film reduces reflections of radiation during the selective exposing of the radiation sensitive film. A fabrication process using the lithography process is also described.

6 Claims, 6 Drawing Sheets

LITHOGRAPHY PROCESS USING ONE OR MORE ANTI-REFLECTIVE COATING FILMS AND FABRICATION PROCESS USING THE LITHOGRAPHY PROCESS

BACKGROUND OF THE INVENTION

1. Technical Field

The present invention generally relates to a lithography process and a fabrication process using the lithography process and, more particularly, to a lithography process which utilizes one or more anti-reflective coating films and a fabrication process using the lithography process.

2. Description of the Related Art

In the fabrication of semiconductor integrated circuits such as semiconductor memory devices, optical photofabrication techniques may be used to provide desired patterns for circuit features. These techniques typically involve the controlled projection of actinic light (e.g., ultraviolet (UV) or deep ultraviolet (DUV) radiation) in order to transfer a pattern from a photolithographic mask onto a layer of light-sensitive material such as a resist deposited on a substrate. The mask typically embodies a light transmissive substrate with a layer of light blocking material defining the patterns of circuit features to be transferred to the resist coated substrate. If a negative resist is used, then the projected exposure light passing through the mask will cause the exposed areas of the resist layer to undergo polymerization and cross-linking, resulting in an increased molecular weight. In a subsequent development step, unexposed portions of the resist layer will wash off with the developer, leaving a pattern of resist material constituting a reverse or negative image of the mask pattern. Alternatively, if a positive resist is used, the exposure light passing through the mask will cause the exposed portions of the resist layer to become soluble to the developer, such that the exposed resist layer portions will wash away in the development step, leaving a pattern of resist material corresponding directly to the mask pattern. In both cases, the remaining resist will serve to define a pattern of exposed material that will undergo subsequent fabrication steps (e.g., etching and deposition) for forming the desired semiconductor devices. The exposed material may, for example, be an insulator, a conductor, or a semiconductor.

One problem which occurs in lithography processes is that light is reflected back into the resist from the underlying substrate. This problem is particularly acute in lithography processes for fabricating non-planar substrates. These reflections can cause unwanted exposure of the resist, thereby degrading the pattern transfer process. In order to reduce such reflections, a so-called antireflective coating (ARC) film may be applied and baked on the substrate to be fabricated prior to forming the resist. After the resist is applied, patterns are resolved in the resist by exposure light and the patterns are transferred to both the ARC film and the substrate to be fabricated by an etching process such as reactive ion etching (RIE). After the pattern transfer, both the resist and the ARC film are removed. While the use of an ARC film improves the pattern transfer process, the application and removal of the ARC film complicates an overall manufacturing process which includes many separate pattern transfer processes. In addition, in processes such as a dual damascene process, it can be necessary to apply the ARC film to a surface having openings formed therein. The application and complete removal of an ARC film in this situation can be difficult, thereby further complicating the overall fabrication process. Still further, while an antireflective coating film improves the pattern transfer process in terms of reducing reflections, critical dimension bias after the ARC film etching must be taken into account. Thus, it is desirable that the ARC film would be as thin as possible.

Thus, it would be desirable to provide a lithography process which overcomes these and other problems associated with conventional ARC films.

SUMMARY OF THE INVENTION

In accordance with a first aspect of the present invention, a lithography process includes the step of forming an antireflective coating film on a substrate. A film is formed on the antireflective coating film and a radiation sensitive film is formed on the film. The radiation sensitive film is selectively exposed. During the selective exposing, the antireflective coating film covers the lower surface of the portion of film on which the radiation sensitive film is formed, and the antireflective coating film reduces reflections of radiation during the selective exposing of the radiation sensitive film.

In accordance with another aspect of the present invention, a fabrication process includes the step of forming an antireflective coating film on a substrate. A film is formed on the antireflective coating film and a first radiation sensitive film is formed on the film. The first radiation sensitive film is selectively exposed, and the selectively exposed radiation sensitive film is developed to form a patterned first radiation sensitive film. The film is fabricated using the patterned first radiation sensitive film as a mask. The patterned first radiation sensitive film is removed and a second radiation sensitive film is formed on the fabricated film. The second radiation sensitive film is selectively exposed. The selectively exposed second radiation sensitive film is developed to form a patterned second radiation sensitive film and the film is further fabricated using the patterned second radiation sensitive film as a mask. The antireflective coating firm reduces reflections of radiation during the selective exposing of both the first and second radiation sensitive films.

In accordance with yet another aspect of the present invention, a method of forming an opening in an insulating film formed on a substrate is provided, wherein the opening has first and second opening portions. A first antireflective coating film is formed on the substrate and the insulating film is formed on the first antireflective coating film. A first radiation sensitive film is formed on the insulating film and the first radiation sensitive film is selectively exposed. The selectively exposed radiation sensitive film is developed to form a patterned first radiation sensitive film and the insulating film is etched to form the first opening portion using the patterned first radiation sensitive film as a mask. The patterned first radiation sensitive film is removed and a second radiation sensitive film is formed on the insulating film having the first opening portion. The second radiation sensitive film is selectively exposed and the selectively exposed second radiation sensitive film is developed to form a patterned second radiation sensitive film. The insulating film is further etched to form the second opening portion using the patterned second radiation sensitive film as a mask, wherein the first antireflective coating film reduces reflections of radiation during the selective exposing of both the first and second radiation sensitive films.

These and other features and advantages of the present invention will be better understood from a reading of the following detailed description in conjunction with the accompanying drawings.

DETAILED DESCRIPTION

Figure 1A:
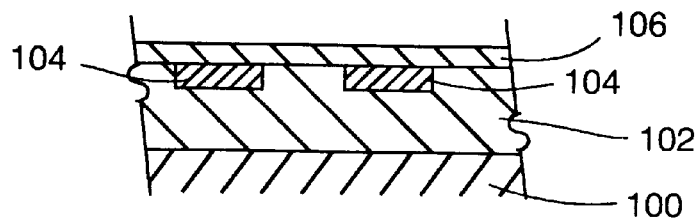
FIGS. 1(a)–1(g) illustrate a method in accordance with the present invention.

A method of the present invention as applied to a dual damascene structure for contacting metal lines will be described with respect to FIGS. (a)–1(g). A "damascene" process refers to a process in which a trench or via is formed and then filled in with a conducting material, followed by planarization. A dual damascene process involves the simultaneous fabrication of a conductive via and a conductive wiring. Such a process reduces the number of process steps and eliminates an interface between the conductive via and the conductive wiring. FIG. 1(a) shows a first insulating layer 102 of, for example, silicon dioxide ($SiO_2$), borophosphosilicate glass (BPSG), phosphosilicate glass (PSG), or silicon nitride ($Si_3N_4$) formed on an underlying substrate 100. Substrate 100 may be a substrate of insulating, conducting, or semiconducting material. First insulating layer 102 has conductive lines 104 formed therein by the damascene process. Conductive lines 104 may be formed of tungsten (W), and have a thickness of about 200 nm (nanometers) and a width of about 300 nm (nanometers). In accordance with the damascene process, openings are formed in first insulating layer 102 using a conventional lithography process, followed by RIE. Tungsten is then deposited by sputtering or by chemical vapor deposition and planarized by a chemical mechanical polishing (CMP) process, wherein the first insulating layer 102 is used a stopper layer for the CMP process. If desired, an adhesion/barrier layer of, for example, titanium nitride may be formed prior to the sputtering or the deposition of the tungsten.

An ARC film 106 having a thickness of about 20 nanometers (nm) is then formed on the entire surface of first insulating layer 102 having metal lines 104 formed therein. In the presently described embodiment, ARC film 106 is a titanium oxide ($TiO_2$) film which is formed by a room temperature sputtering process for 1–3 minutes using a Ceraus tool available from ULVAC in which argon or oxygen is sputtered at a titanium target. Generally, a reactive DC magnetron sputtering process or an RF magnetron sputtering process may be utilized. A target comprising two or more metals (e.g., titanium and niobium) may be used to form other titanium oxides. In general, ARC film 106 may be formed of titanium oxides such as $Ti_xO_y$ and $Ti_xNb_yO_z$ (where x, y, and z are constants) or some other metal or non-metal oxides. A copolymer film of a metal and an organic polymer may also be utilized. In some instances, non-insulating materials such as titanium nitride (TiN) may be used. If non-insulating materials such as TiN are utilized, they must be insulated from any underlying conductors such as metal wiring patterns.

Figure 1B:
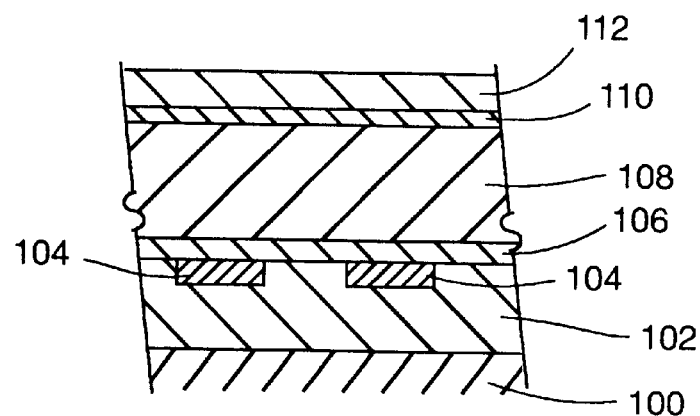

Referring to FIG. 1(b), a second insulating film 108 is formed on ARC film 106. Second insulating film 108 has a thickness of about 1100 nm and may be, for example, a TEOS film formed by low pressure chemical vapor deposition (LPCVD). A conventional organic ARC film 110 (such as BARL available from Shipley) having a thickness of about 45 nanometers (nm) is then formed on second insulating film 108.

A first radiation sensitive film 112 such as a resist is formed on ARC film 110. Radiation sensitive film 112 may be a resist having a thickness of about 850 nanometers and may, for example, be APEX-E or UVIIHS manufactured by Shipley. However, the invention may generally utilize any types of resists including by way of example, but not by way of limitation, chemically amplified resists, non-chemically amplified resists, positive-type resists, and negative-type resists. The resist is exposed using a mask (not shown) which defines a pattern in resist 112. The exposure tool may be a Micrascan II available from SVGL, Inc. or an NSR-S201A available from Nikon Corp. In more advanced lithography, a 193 nanometer single-band ArF excimer laser may be used.

Figure 1C:
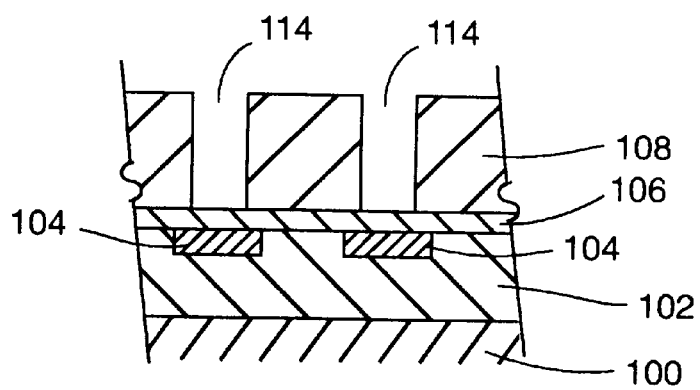

With reference to FIG. 1(c), ARC film 110 and second insulating film 108 are etched by RIE to form contact holes 114. ARC film 110 is etched, for example, using an $O_2$ gas or an $O_2/CF_4$ mixed gas. Second insulating film 108 is etched, for example, using a $CF_4$ gas or some other $CF_4$ type gas. The etching selectivity of resist 112 to second insulating film 108 is relatively high. After etching, the remaining portions of resist 112 and ARC film 110 are removed.

Figure 1D:
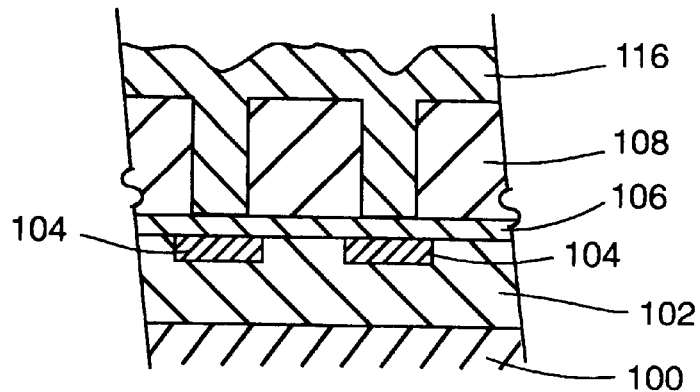
Figure 1E:
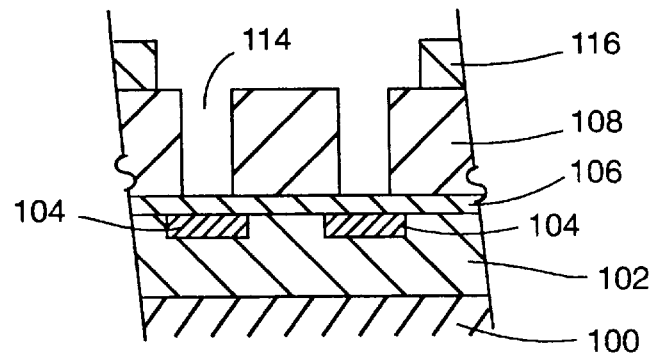
Figure 1F:
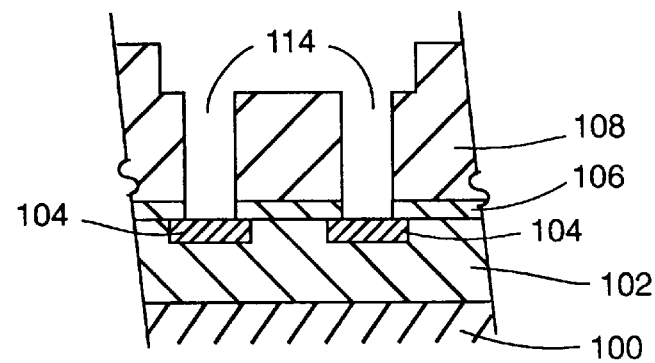

With reference to FIG. 1(d), a second radiation sensitive film 116 such as a resist is formed on the upper surface of second insulating film 108 and to fill in openings 114. For example, radiation sensitive film 116 may be a resist such as APEX-E or UVIIHS manufactured by Shipley and have a thickness of about 850 nanometers. The resist is then exposed using a mask (not shown) and developed to define a pattern in the resist as shown in FIG. 1(e). ARC film 106 which covers first insulating film 102 serves as an antireflective film during this exposure step to prevent reflection. Second insulating film 108 is then etched using the patterned resist 116 as a mask. After the etching of the second insulating film 108, ARC film 106 is etched to expose the metal lines 104 as shown in FIG. 1(f). ARC film 106 may be etched using a $BCl_3/Cl_2/N_2$ mixed gas using, for example, a TCP 9600 etcher available from LAM Research Corp. If a process for removing etching residue including ($TiO_2$) is needed, a solution of dimethyl formamide+$NH_2OH$+$NH_4F$+ diethyleneglycolmonomethylether+PH adjuster may be utilized.

Figure 1G:
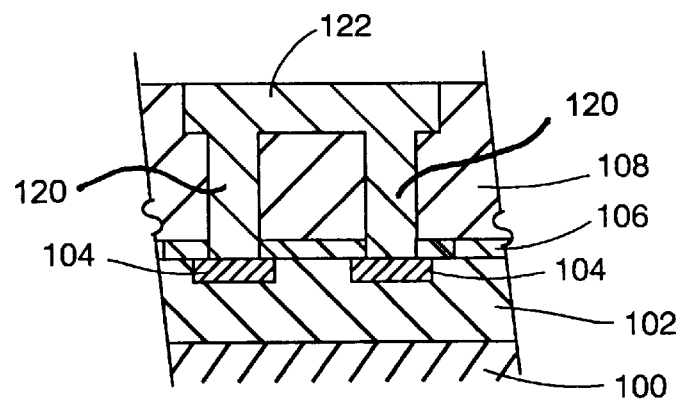

With reference to FIG. 1(g), a conductive material such as tungsten is then deposited by, for example, a sputtering or blanket CVD process on the upper surface of second insulating film 108 and to fill in openings 114, thereby simultaneously forming contacts 120 and metal line 122. The conductive material is then planarized. If desired, an adhesion/barrier layer of; for example, titanium nitride can be formed prior to the deposition of the tungsten.

In accordance with the method of the present invention, improvements in a dual damascene process can be achieved.

Specifically, a first ARC film covers the layer underneath the layer to be fabricated and a second ARC film is formed on the layer to be fabricated. In this way, even after the second ARC film is removed, an ARC film is provided for the lithography process for forming the line patterns without the necessity of an extra step of forming and removing such a layer after the lithography process for forming the via openings. Specifically, ARC film 106 plays the role of an antireflective coating for the lithography processes for forming both the via openings and the lines.

Figure 2:
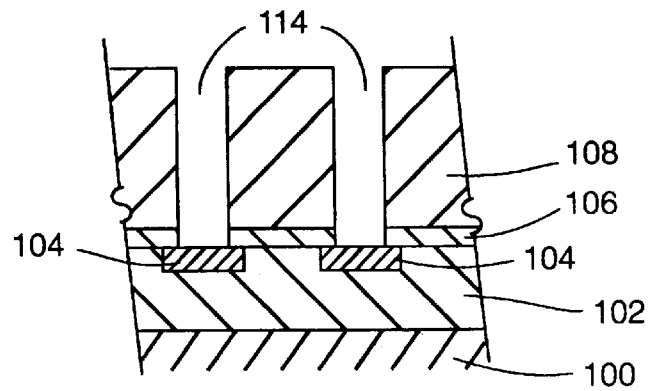
FIG. 2 illustrates a modification to the method of FIGS. 1(a)–1(g).

In a variation of the above-described embodiment, ARC film 106 may be etched after the step of etching openings 106 as shown in FIG. 2. In this case, after the etching process for etching openings 106, the etching tool or etching conditions may be changed to etch ARC film 106.

In the method shown in FIGS. 1(a)–1(g) the contact (or via) opening is formed prior to forming the trench for the wiring. However, the invention is not limited in this respect and the method may be modified to form the trench for the wiring prior to forming the contact (or via) opening.

In addition, while the method of FIGS. 1(a)–1(g) includes the step of forming ARC film 110, this step may be omitted.

Further, the forming of an ARC film under a layer to be fabricated is not limited to the dual damascene process described above. For example, an ARC film may be formed under insulating layer 102 for the damascene process for forming conductive lines 104. Specifically, a titanium oxide layer may be formed on substrate 100 prior to the formation of first insulating layer 102. In the lithography process for patterning the resist for use as mask for forming the openings in first insulating layer 102, this ARC film formed under insulating layer 102 serves as an antireflective film. If desired, to improve antireflection performance, a conventional ARC film may also be formed on first insulating layer 102.

EXAMPLE 1

Figure 3A:
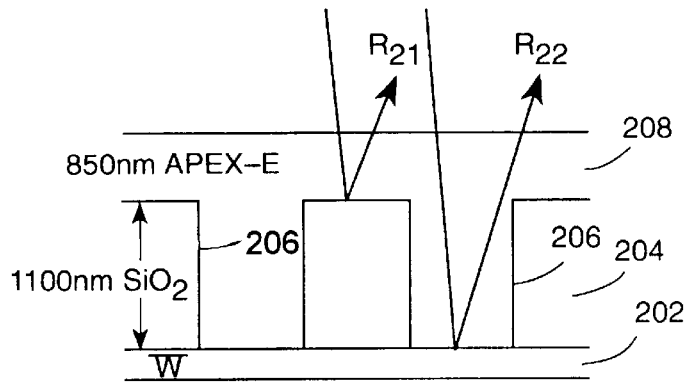
FIG. 3(a) illustrates a first structure used to demonstrate advantages of the method of FIGS. 1(a)–1(f).
Figure 3B:
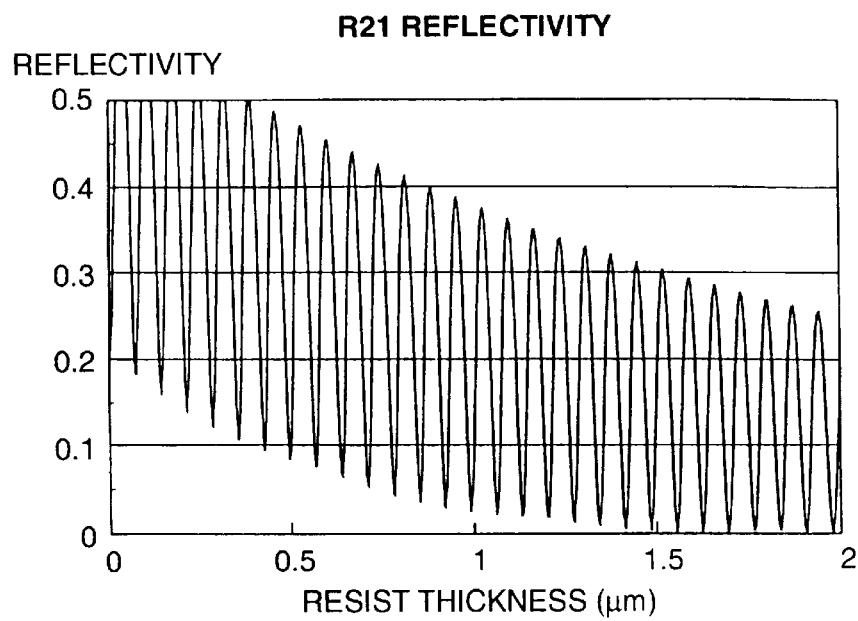
FIGS. 3(b) and 3(c) are graphs of the reflectivity from portions of the structure of FIG. 3(a) as a function of the thickness of resist 208.
Figure 3C:
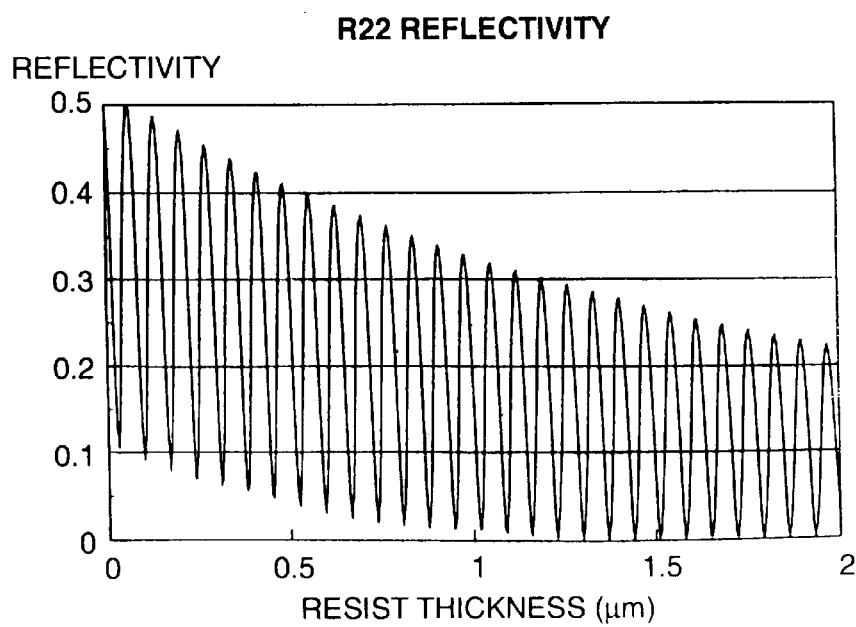

FIG. 3(a) shows a silicon dioxide film 204 having a thickness of 1100 nanometers formed on tungsten film 202. Openings 206 are formed in silicon dioxide film 204. An APEX-E resist 208 having a thickness of 850 nanometers is formed on the upper surface of silicon dioxide film 204 and to fill in openings 206. $R_{21}$ indicates the reflectivity from the upper surface of silicon dioxide film 204 and $R_{22}$ indicates the reflectivity from the portion of tungsten film 202 exposed by openings 206. FIG. 3(b) is a graph illustrating the reflectivity $R_{21}$ as a function of resist thickness in micrometers and FIG. 3(c) is a graph illustrating the reflectivity $R_{22}$ as a function of resist thickness in micrometers.

Figure 4A:
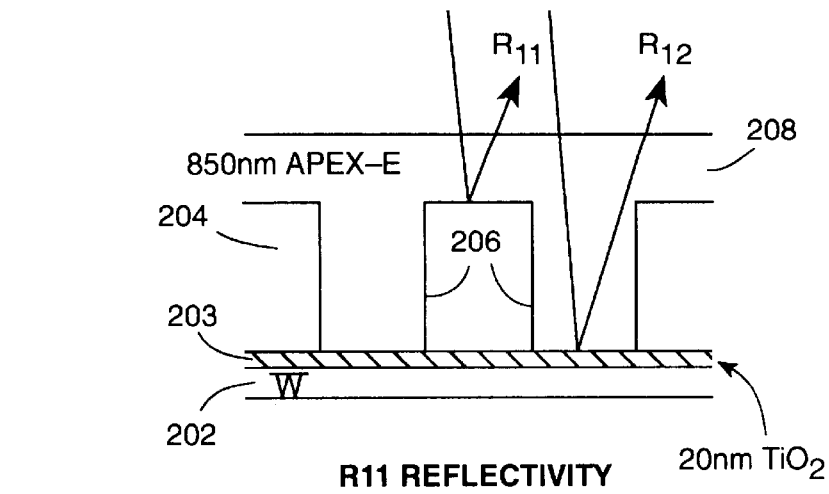
FIG. 4(a) illustrates a second structure used to demonstrate advantages of the method of FIGS. 1(a)–1(f).
Figure 4B:
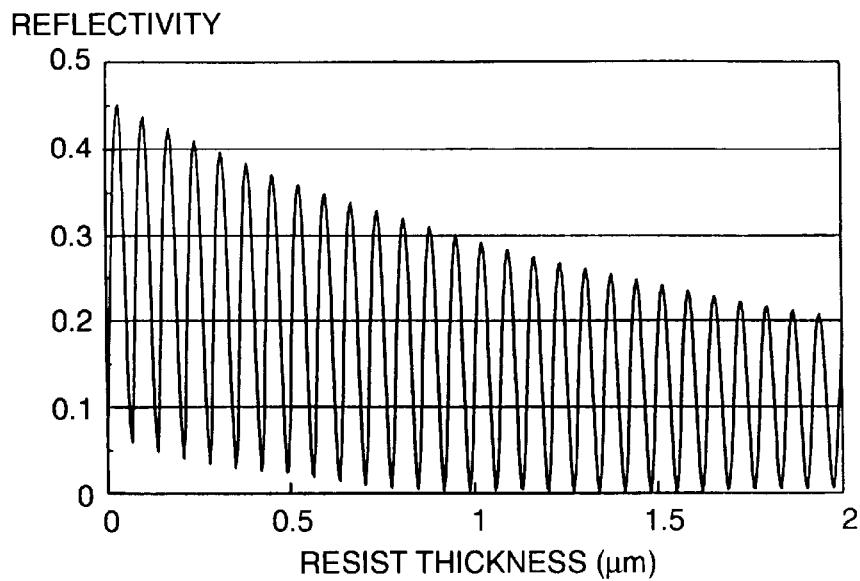
FIGS. 4(b) and 4(c) are graphs of the reflectivity from portions of the structure of FIG. 4(a) as a function of the thickness of resist 208.
Figure 4C:
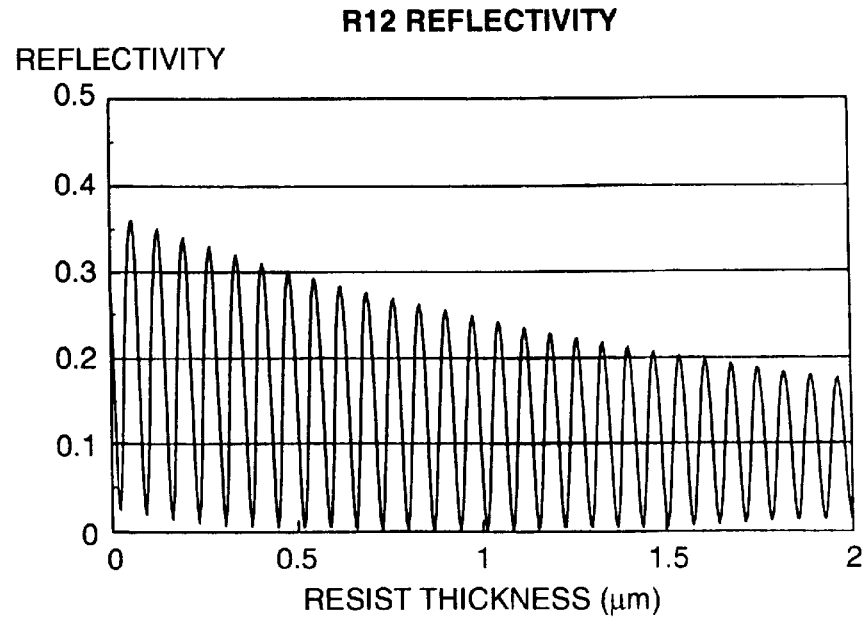

FIG. 4(a) shows a titanium oxide ($TiO_2$) film 203 having a thickness of 20 nanometers formed on a tungsten film 202. A silicon dioxide film 204 having a thickness of 1100 nanometers is formed on titanium oxide film 203. Openings 206 are formed in silicon dioxide film 204. An APEX-E resist 208 having a thickness of 850 nanometers is formed on the upper surface of silicon dioxide film 204 and on the surface of titanium oxide film 203 exposed by openings 206. $R_{11}$ indicates the reflectivity from the upper surface of silicon dioxide film 204 and $R_{12}$ indicates the reflectivity from the portion of titanium oxide film 203 exposed by openings 206. FIG. 4(b) is a graph illustrating the reflectivity $R_{11}$ as a function of resist thickness in micrometers and FIG. 4(c) is a graph illustrating the reflectivity $R_{12}$ as a function of resist thickness in micrometers.

Figure 5A:
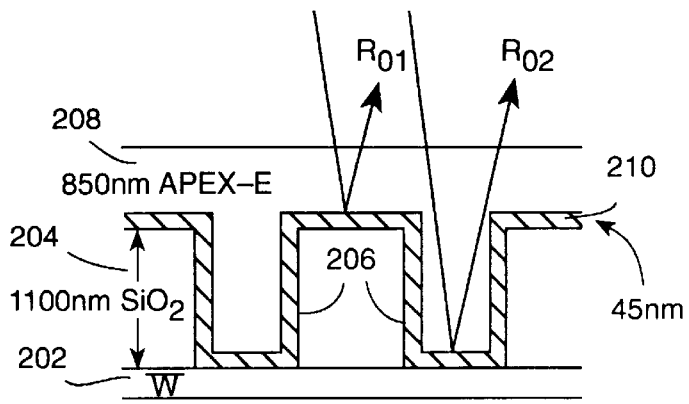
FIG. 5(a) illustrates a third structure used to demonstrate advantages of the method of FIGS. 1(a)–1(f).
Figure 5B:
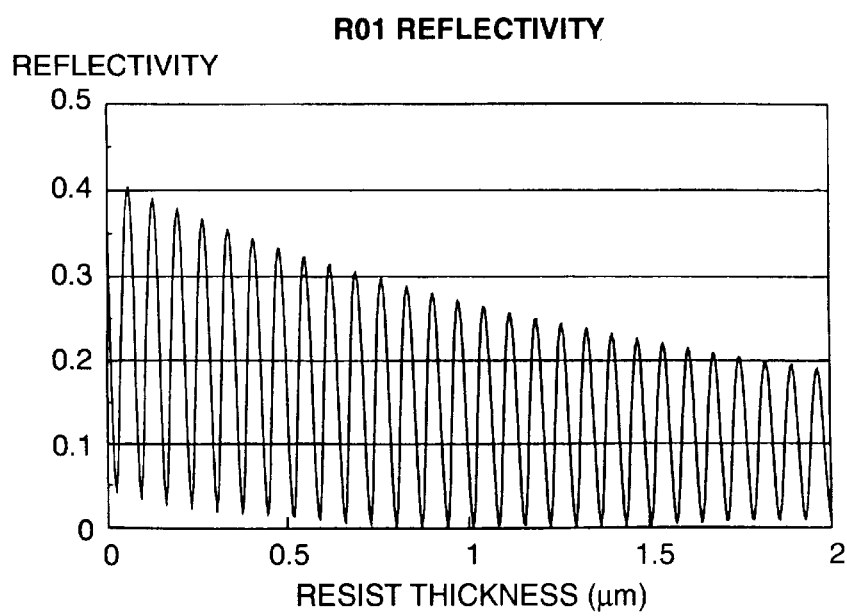
FIGS. 5(b) and 5(c) are graphs of the reflectivity from portions of the structure of FIG. 5(a) as a function of the thickness of resist 208.
Figure 5C:
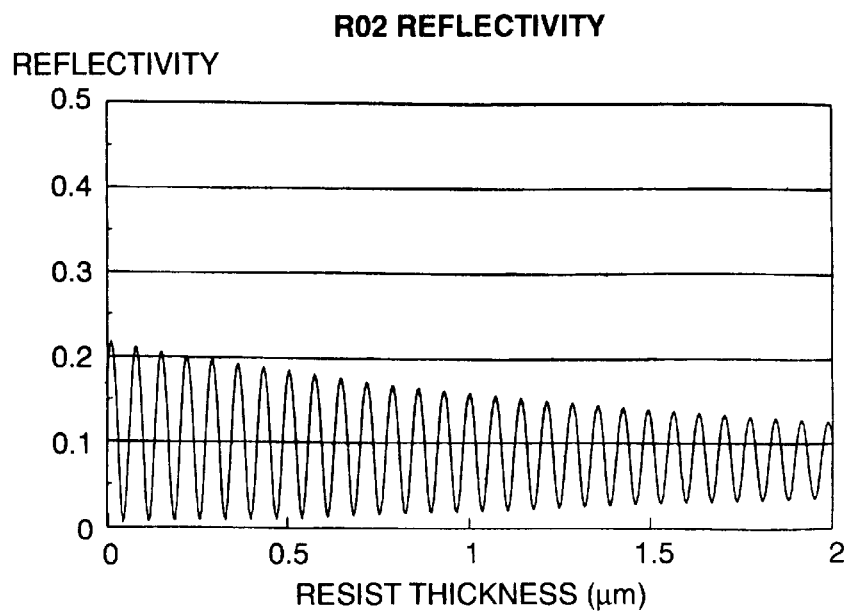

FIG. 5(a) shows a silicon dioxide film 204 having a thickness of 1100 nanometers formed on a tungsten film 202. Openings 206 are formed in silicon dioxide film 204. An ARC film 210 of BARL available from Shipley having a thickness of 45 nanometers is formed on the upper surface of silicon dioxide film 204, on the sidewalls of openings 206, and on the surface of tungsten film 202 exposed by openings 206. An APEX-E resist 208 having a thickness of 850 nanometers is formed on ARC film 210. $R_{01}$ indicates the reflectivity from the portion of ARC film 210 formed on the upper surface of silicon dioxide film 204 and $R_{02}$ indicates the reflectivity from the portion of ARC film 210 formed on the exposed surface of tungsten film 202. FIG. 5(b) is a graph illustrating the reflectivity $R_{01}$ as a function of resist thickness in micrometers and FIG. 5(c) is a graph illustrating the reflectivity $R_{02}$ as a function of resist thickness in micrometers.

As can be seen from FIGS. 3(b), 3(c), 4(b), 4(c), 5(b), and 5(c), both the ARC film of the present invention (FIG. 4(a)) and the conventional ARC film (FIG. 5(a)) are effective to reduce reflectivity as compared to the situation where no ARC film is used. It can be seen that the effectiveness of both the ARC film of the present invention and the conventional ARC film can be improved by forming the resist to have increased thickness.

EXAMPLE 2

Figure 6:
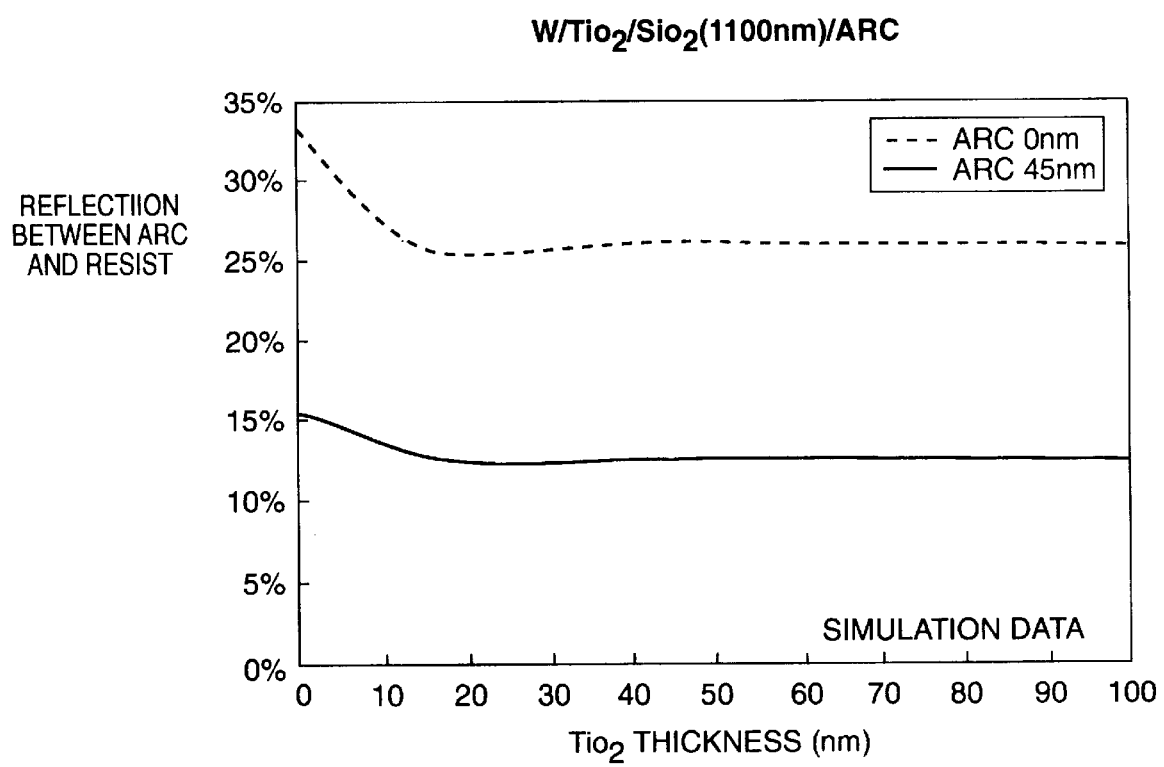
FIG. 6 is a graph of reflectance as a function of titanium oxide thickness for a tungsten/titanium oxide/silicon dioxide/ARC structure in the case of an ARC having a thickness of 0 nanometers and an ARC having a thickness of 45 nanometers.

In order to further demonstrate the advantages of the present invention, simulation data was generated for a structure including a tungsten layer, a titanium oxide layer, a silicon dioxide layer having a thickness of 1100 nanometers, and an ARC film of BARL available from Shipley. The simulation data shows the reflectance between the ARC film and the resist at various thicknesses of the titanium oxide layer for a first situation in which the ARC film has a thickness of 0 nanometers (i.e., no ARC film) and for a second situtation in which the ARC film has a thickness of 45 nanometers. As can be seen in FIG. 6, in both cases, the reflectivity decreases by using a titanium oxide layer in accordance with the present invention as described above. It can be seen that it is not necessary to increase the thickness of the titanium oxide layer much above 20 nanometers since the graph shows that the antireflection performance is not significantly changed for increasing thicknesses above about 20 nanometers.

While the invention has been described in detail with reference to the appended drawings, the invention is limited in scope only by the claims. Moreover, any patent or publication cited herein should be construed to be incorporated by reference as to any subject matter deemed essential to the present disclosure.

We claim:

1. Method for executing a dual damascene process for a multi-level metallization and interconnection structure comprising the steps of:

forming a first insulating layer on a substrate, said first insulating layer having a first conductive line and a second conductive line which are embedded in an upper portion thereof and separated from each other;

forming a first antireflective coating film on said first insulating layer with said first and second conductive lines, said first antireflective coating film including a material selected from the group consisting of titanium oxide and titanium niobium oxide;

forming a second insulating layer on said first antireflective coating film;

forming a second antireflective coating film on said second insulating layer, said second antireflective coating film including said material selected from said group of titanium oxide and titanium niobium oxide;

forming a first radiation sensitive film on said second antireflective coating film;

selectively exposing said first radiation sensitive film by using light having a wavelength corresponding to an ArF excimer laser;

forming a first opening and a second opening in said second insulating layer by developing said first radiation sensitive film to obtain a first mask for etching from said first radiation sensitive film and then etching said second insulating layer by using said first mask;

forming a second radiation sensitive film to fill in at least said first opening and second opening;

selectively exposing said second radiation sensitive film and then developing said second radiation sensitive film to obtain a second mask for etching from said second radiation sensitive film, said second mask having a hole with a first area larger than a second area wherein said second area includes said first and second openings in said second insulating layer;

etching said second insulating layer to a predetermined depth by using said second mask to form a wiring trench in said first area and then removing portions of said first antireflective coating film in positions corresponding to bottoms of said first and second openings to expose surfaces of said first and second conductive lines;

depositing a conductive material to fill in said first and second openings and said wiring trench; and flattening said conductive material and forming a first contact in said first opening and a second contact in said second opening, and forming, in said wiring trench, a wiring which electrically connects said first and second contacts.

2. The method according to claim 1, wherein each of said first and second radiation sensitive films is a photoresist.

3. The method according to claim 1, wherein said light has a wavelength of 193 nm.

4. A method for executing a dual damascene process for a multi-level metallization and interconnection structure comprising the steps of:

forming a first insulating layer on a substrate, said first insulating layer having a first conductive line and a second conductive line which are embedded in an upper portion thereof and separated from each other;

forming a first antireflective coating film on said first insulating layer with said first and second conductive fines, said first antireflective coating film including a material selected from the group consisting of titanium oxide and titanium niobium oxide;

forming a second insulating layer on said first antireflective coating film;

forming a second antireflective coating film on said second insulating layer, said second antireflective coating film including said material selected from said group of titanium oxide and titanium niobium oxide;

forming a first radiation sensitive film on said second antireflective coating film;

selectively exposing said first radiation sensitive film by using light having a wavelength corresponding to an ArF excimer laser;

developing said first radiation sensitive film to prepare a first mask for etching from said first radiation sensitive film and etching said second insulating layer by using said first mask to form a first opening and a second opening in said second insulating layer, and removing portions of said first antireflective coating film in positions corresponding to bottoms of said first and second openings to expose surfaces of said first and second conductive lines;

forming a second radiation sensitive film to fill in at least said first and second openings;

selectively exposing said second radiation sensitive film and then developing said second radiation sensitive film to obtain a second mask for etching from said second radiation sensitive film, said second mask having a hole with a first area larger than a second area wherein said second area includes said first and second openings in said second insulating layer;

etching said second insulating layer to a predetermined depth by using said second mask to form a wiring trench in said first area;

depositing a conductive material to fill in said first and second openings and said wiring trench; and flattening said conductive material and forming a first contact in said first opening and a second contact in said second opening, and forming, in said wiring trench, a wiring which electrically connects said first and second contacts.

5. The method according to claim 4, wherein each of said first and second radiation sensitive films is a photoresist.

6. The method according to claim 4, wherein said light has a wavelength of 193 nm.

* * * * *